(12) United States Patent
Kim et al.

(10) Patent No.: US 10,948,770 B2
(45) Date of Patent: Mar. 16, 2021

(54) LIGHT SOURCE, BACK LIGHT UNIT, AND DISPLAY DEVICE

(71) Applicant: SAMSUNG ELECTRONICS CO., LTD., Suwon-si (KR)

(72) Inventors: Tae Hyung Kim, Seoul (KR); Eun Joo Jang, Suwon-si (KR); Hyun A Kang, Suwon-si (KR); Yongwook Kim, Suwon-si (KR); Jihyun Min, Seoul (KR); Jeong Hee Lee, Seongnam-si (KR); Shin Ae Jun, Seongnam-si (KR); Oul Cho, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 398 days.

(21) Appl. No.: 15/238,127

(22) Filed: Aug. 16, 2016

(65) Prior Publication Data
US 2017/0115529 A1 Apr. 27, 2017

(30) Foreign Application Priority Data
Oct. 23, 2015 (KR) .......................... 10-2015-0147989

(51) Int. Cl.
*G02F 1/1335* (2006.01)
*G02F 1/13357* (2006.01)
(Continued)

(52) U.S. Cl.
CPC ..... *G02F 1/133603* (2013.01); *G02B 6/0026* (2013.01); *G02B 6/0046* (2013.01);
(Continued)

(58) Field of Classification Search
CPC ......... G02F 1/133603; G02F 1/133514; G02F 1/1336; G02F 2001/133614;
(Continued)

(56) References Cited

U.S. PATENT DOCUMENTS

| 8,481,113 B2 | 7/2013 | Bawendi et al. |
| 8,487,331 B2 | 7/2013 | Jang et al. |

(Continued)

FOREIGN PATENT DOCUMENTS

| JP | 201481636 A | 5/2014 |
| KR | 100502884 B1 | 7/2005 |

(Continued)

*Primary Examiner* — Charles S Chang
(74) *Attorney, Agent, or Firm* — Cantor Colburn LLP

(57) ABSTRACT

A light source includes a light emitting element and a light conversion layer configured to convert light emitted from the light emitting element into white light; wherein the light conversion layer includes a matrix resin and a quantum dot, wherein the white light includes a red light component, a green light component, and a blue light component each having a color purity configured to display a color gamut having a concordance rate of greater than or equal to about 99.0% with an Adobe RGB color gamut of a display device, and wherein the green light component has a peak wavelength of about 525 nanometers to about 528 nanometers and a full width at half maximum of less than or equal to about 40 nanometers, and a red light component having a peak wavelength of about 625 nanometers to about 645 nanometers.

32 Claims, 5 Drawing Sheets

(51) Int. Cl.
*F21V 8/00* (2006.01)
*H01L 33/50* (2010.01)
*B82Y 20/00* (2011.01)
*B82Y 30/00* (2011.01)

(52) U.S. Cl.
CPC ......... *G02B 6/0051* (2013.01); *G02B 6/0068* (2013.01); *G02B 6/0073* (2013.01); *G02F 1/1336* (2013.01); *H01L 33/504* (2013.01); *B82Y 20/00* (2013.01); *B82Y 30/00* (2013.01); *G02F 2001/133614* (2013.01); *G02F 2202/36* (2013.01); *H01L 33/502* (2013.01); *Y10S 977/774* (2013.01); *Y10S 977/825* (2013.01); *Y10S 977/95* (2013.01); *Y10S 977/952* (2013.01)

(58) Field of Classification Search
CPC . G02F 2202/36; G02B 6/0046; G02B 6/0073; G02B 6/0068; G02B 6/0026; G02B 6/0051; H01L 33/504; H01L 33/502; Y10S 977/774; Y10S 977/825; Y10S 977/95; B82Y 20/00; B82Y 30/00
USPC ...................................................... 349/69–71
See application file for complete search history.

(56) References Cited

U.S. PATENT DOCUMENTS

| | | | |
|---|---|---|---|
| 8,702,277 B2 | 4/2014 | Im et al. | |
| 8,785,906 B2 | 7/2014 | Miller et al. | |
| 8,919,997 B2 | 12/2014 | Im et al. | |
| 8,919,998 B2 | 12/2014 | Im et al. | |
| 2009/0115714 A1* | 5/2009 | Jeong | G02F 1/133514 345/88 |
| 2010/0289044 A1 | 11/2010 | Krames et al. | |
| 2014/0119149 A1 | 5/2014 | Hendrickson | |
| 2015/0268408 A1* | 9/2015 | Ohta | G01J 3/505 349/65 |
| 2015/0323728 A1* | 11/2015 | Lee | G02B 6/0043 362/97.1 |
| 2016/0186960 A1* | 6/2016 | Kim | F21V 9/30 349/71 |
| 2017/0018692 A1* | 1/2017 | Oh | H01L 33/504 |
| 2017/0146856 A1* | 5/2017 | Yokota | G02F 1/133514 |
| 2017/0371205 A1* | 12/2017 | Pellerite | G02F 1/1336 |

FOREIGN PATENT DOCUMENTS

| | | |
|---|---|---|
| KR | 1020110109714 A | 10/2011 |
| KR | 101489280 B1 | 1/2015 |
| WO | 2014123724 A1 | 8/2014 |

* cited by examiner

LIGHT SOURCE, BACK LIGHT UNIT, AND DISPLAY DEVICE

CROSS-REFERENCE TO RELATED APPLICATION

This application claims priority to and the benefit of Korean Patent Application No. 10-2015-0147989 filed in the Korean Intellectual Property Office on Oct. 23, 2015, and all the benefits accruing therefrom under 35 U.S.C. § 119, the content of which in its entirety is incorporated herein by reference.

BACKGROUND

1. Field

This disclosure relates to a light source, a backlight unit, and a display device.

2. Description of the Related Art

A liquid crystal display (LCD), which is a light receiving element, uses a backlight unit as a light source. The backlight unit includes a light emitting element. As for the light emitting element of the backlight unit, a CCFL (cold cathode fluorescent light) has been used, but a light emitting diode has also been widely used.

The light emitting diode uses a semiconductor, and as such, has a long life span, is able to be down-sized, consumes a small amount of power, and includes no mercury, and thus has environmentally-friendly characteristics. Accordingly, the light-emitting diode has drawn attention as one of the next generation light emitting elements capable of replacing the CCFL light emitting element. By applying a light emitting diode to a backlight, a color gamut that the display device is capable of expressing may be enlarged to a certain degree, however, there remains a need for an improved light source or a backlight unit that provides a display device having high color reproducibility.

SUMMARY

An embodiment provides a light source and a backlight unit that provides white light capable of expressing a color gamut of greater than or equal to a certain area based on an Adobe RGB standard color gamut.

Another embodiment provides a display device including a light source or a backlight unit.

According to an embodiment, a light source includes a light emitting element and a light conversion layer configured to convert light emitted from the light emitting element into white light, wherein the light conversion layer includes a matrix resin and a quantum dot, wherein the white light comprises a red light component, a green light component, and a blue light component each having a color purity configured to display a color gamut having a concordance rate of greater than or equal to about 99.0% with an Adobe RGB color gamut of a display device, and the green light component has a peak wavelength of about 525 nanometers (nm) to about 528 nm and a full width at half maximum (FWHM) of less than or equal to about 40 nm, and the red light component has a peak wavelength of about 625 nm to about 645 nm.

The white light may include the green light component having a peak wavelength of about 526 nm to about 528 nm and a full width at half maximum (FWHM) of less than or equal to about 40 nm, and the red light component having a peak wavelength of about 635 nm to about 645 nm, and red light component, the green light component, and the blue light component may each have a color purity configured to display a color gamut having a concordance rate of about 100.0% with an Adobe RGB color gamut of a display device.

The red light component may have a FWHM of less than or equal to about 50 nm.

The light emitted from the light emitting element may have a peak wavelength of about 445 nm to about 455 nm and a FWHM of less than or equal to about 45 nm.

A red apex may be positioned in a region of 0.66<Cx<0.70 and 0.28<Cy<0.33, and a green apex may be positioned in a region of 0.19<Cx<0.22 and 0.70<Cy<0.72, based on xy color coordinates of the white light.

In an embodiment, a red apex may be positioned in the region of 0.660<Cx<0.700 and 0.290<Cy<0.320, and a green apex may be positioned in the region of 0.200<Cx<0.215 and 0.700<Cy<0.720, based on xy color coordinates of the white light.

The white light may have a ratio ($O_h/G_h$) of a height of a peak wavelength of the green light component overlapping a wavelength of the red light component ($O_h$) to a height of the peak wavelength of the green light component ($G_h$), which is less than or equal to about 0.15.

The white light may have a ratio ($O_h/R_h$) of a height of a peak wavelength of the green light component overlapping the red light component ($O_h$) to a height of a peak wavelength of the red light component ($R_h$), which is less than or equal to about 0.20.

The quantum dot may not include cadmium (Cd). The quantum dot may be a Group II-VI semiconductor nanocrystal selected from ZnS, ZnSe, ZnTe, HgS, HgSe, HgTe, ZnSeS, ZnSeTe, ZnSTe, HgSeS, HgSeTe, HgSTe, HgZnS, HgZnSe, HgZnTe, HgZnSeS, HgZnSeTe, and HgZnSTe; a Group III-V semiconductor nanocrystal selected from GaN, GaP, GaAs, AlN, AlP, AlAs, InN, InP, InZnP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs, a Group IV-IV semiconductor nanocrystal selected from SbTe; or a combination thereof.

The quantum dot may include a core including InP, InZnP, or a combination thereof, and a shell including ZnSe, ZnS, or a combination thereof.

According to another embodiment, a backlight unit includes a light emitting element, a light conversion layer configured to convert light emitted from the light emitting element into white light, and an optical film on the light conversion layer, wherein the light conversion layer includes a matrix resin and a quantum dot, wherein the white light includes a red light component, a green light component, and a blue light component each having a color purity configured to display a color gamut having a concordance rate of greater than or equal to about 99.7% with an Adobe RGB color gamut of a display device, and the green light component has a peak wavelength of about 525 nm to about 528 nm and a full width at half maximum (FWHM) of less than or equal to about 40 nm, and a red light component having a peak wavelength of about 625 nm to about 645 nm.

The white light may include the green light component having a peak wavelength of about 526 nm to about 528 nm and a full width at half maximum (FWHM) of less than or equal to about 40 nm, and a red light component having a peak wavelength of about 635 nm to about 645 nm, and the white light may include the red light component, the green light component, and the blue light component each having a color purity configured to display a color gamut having a concordance rate of about 100.0% with an Adobe RGB color gamut of a display device.

The red light component may have a FWHM of less than or equal to about 50 nm.

The light emitted from the light emitting element may have a peak wavelength of about 445 nm to about 455 nm and a FWHM of less than or equal to about 45 nm.

A red apex may be positioned in the region of $0.66<Cx<0.70$ and $0.28<Cy<0.33$, and a green apex may be positioned in the region of $0.19<Cx<0.22$ and $0.70<Cy<0.72$, based on xy color coordinates of the white light.

In an embodiment, a red apex may be positioned in the region of $0.660<Cx<0.700$ and $0.290<Cy<0.320$, and a green apex may be positioned in the region of $0.200<Cx<0.215$ and $0.700<Cy<0.720$, based on xy color coordinates of the white light.

The white light may have a ratio of a height of a peak wavelength of the green light component overlapping a wavelength of the red light component ($O_h$) to a height of a peak wavelength of the green light component ($G_h$), which is less than or equal to about 0.15.

The white light may have a ratio ($O_h/R_h$) of a height of a peak wavelength of the green light component overlapping a wavelength of the red light component ($O_h$) to a height of a peak wavelength of the red light component ($R_h$), which is less than or equal to about 0.20.

According to another embodiment, a display device includes a liquid crystal panel including a plurality of color filters, and a backlight unit including a light emitting element and a light conversion layer configured to convert light emitted from the light emitting element into white light, wherein the backlight unit is configured to supply the white light to the liquid crystal panel. The backlight unit includes a light emitting element; a light conversion layer configured to convert light emitted from the light emitting element into white light; and an optical film on the light conversion layer, wherein the light conversion layer comprises a matrix resin and a quantum dot.

The white light includes a green light component having a peak wavelength of about 525 nm to about 528 nm and a full width at half maximum (FWHM) of less than or equal to about 40 nm, and a red light component having a peak wavelength of about 625 nm to about 645 nm, and the display device displays a color gamut having a concordance rate of greater than or equal to about 99.7% with an Adobe RGB color gamut.

The white light may include a green light component having a peak wavelength of about 526 nm to about 528 nm and a full width at half maximum (FWHM) of less than or equal to about 40 nm, and a red light component having a peak wavelength of about 635 nm to about 645 nm, and the display device displays a color gamut having a concordance rate of about 100.0% with an Adobe RGB color gamut.

The red light component may have a FWHM of less than or equal to about 50 nm.

The light emitted from the light emitting element may have a peak wavelength of about 445 nm to about 455 nm and a FWHM of less than or equal to about 45 nm.

The white light may have a ratio ($O_h/G_h$) of a height of a peak wavelength of the green light component overlapping a wavelength of the red light component to a height of a peak wavelength of the green light component, which is less than or equal to about 0.15, for example less than or equal to about 0.12, or for example about 0.08 to about 0.15.

The white light may have a ratio ($O_h/R_h$) of a height of a peak wavelength of the green light component overlapping a wavelength of the red light component to a height of the peak wavelength of the red light component, which is less than or equal to about 0.20, for example less than or equal to about 0.12, or for example about 0.10 to about 0.18.

A red apex may be positioned in a region of $0.66<Cx<0.70$ and $0.28<Cy<0.33$ and a green apex may be positioned in a region of $0.19<Cx<0.22$ and $0.70<Cy<0.72$, based on xy color coordinates of the white light.

In an embodiment, a red apex may be positioned in the region of $0.660<Cx<0.700$ and $0.290<Cy<0.320$ and a green apex may be positioned in the region of $0.200<Cx<0.215$ and $0.700<Cy<0.720$, based on xy color coordinates of the white light.

After passing through color filters, the white light may have a percentage of areas ($S_{G+R}$) of a green peak and a red peak of less than or equal to about 10% relative to an entire area ($A_B$) of a blue peak in a blue spectrum.

After passing through color filters, the white light may have a percentage of an area ($S_B$) of a blue peak relative to an entire area ($A_G$) of a blue peak in a green spectrum filters of less than or equal to about 1%. After passing through color filters, the white light may have a percentage of a blue peak and a green peak ($S_{B+G}$) relative to an entire area ($A_R$) of a blue peak in a red spectrum.

BRIEF DESCRIPTION OF THE DRAWINGS

The above and other aspects, advantages and features of this disclosure will become apparent by describing in further detail exemplary embodiments thereof with reference to the accompanying drawings in which.

DETAILED DESCRIPTION

Figure 1:
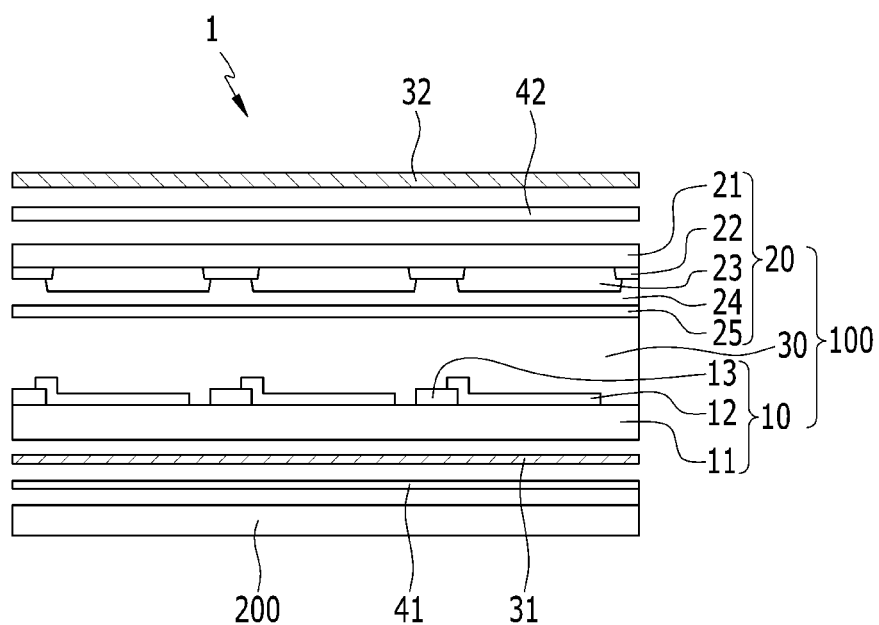
FIG. 1 is a cross-sectional view showing a liquid crystal display (LCD) according to one embodiment.

The present disclosure will be described more fully hereinafter with reference to the accompanying drawings, in which exemplary embodiments are shown.

As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, the term "peak wavelength" refers to a wavelength at a central position of a spectrum.

FIG. 1 is a cross-sectional view of a liquid crystal display (LCD) according to one embodiment.

The liquid crystal display (LCD) 1 according to one embodiment includes a liquid crystal panel 100, a pair of polarizing films 31 and 32 respectively disposed below and above the liquid crystal panel 100, a plurality of compensation films 41 and 42 respectively disposed below and above the liquid crystal panel 100, and a backlight unit 200. The compensation films 41 and 42 may be disposed on only one of an upper surface and a lower surface of the liquid crystal panel 100, and the number thereof may be one or more.

The liquid crystal panel 100 includes a lower panel 10 and an upper panel 20, and a liquid crystal layer 30 interposed between the lower and upper panels 10 and 20. The lower panel 10 may include a transparent substrate 11, a thin film transistor 13 formed on the substrate 11 by a thin film process, and a pixel electrode 12 connected to the thin film transistor 13, the pixel electrode 12 formed by a switching voltage application. The upper panel 20 may include a transparent substrate 21, a light-blocking layer 22, a color filter 23 formed on the transparent substrate 21, a planarization layer 24 covering the light-blocking layer 22 and the color filter 23, and a common electrode 25 covering the planarization layer 24. The pixel electrode 12 is formed at a position on the substrate 11 which corresponds to the position of each color filter 23.

The backlight unit 200 includes a light emitting element which emits blue light or ultraviolet (UV) light, and a light conversion layer including a quantum dot which is capable of converting the blue light or ultraviolet (UV) light into white light. The backlight unit 200 may function as a light source which supplies light to a liquid crystal display (LCD).

The light supplied by the backlight unit 200 is converted into linear polarized light by the lower polarizing film 31, and the phase of the linear polarized light is selectively changed as it passes through the liquid crystal layer 30. The light passing through the liquid crystal layer 30 is filtered into red, green, and blue light wavelengths as it passes through the color filters 23 and reaches the upper polarizing film 32. The red, green, and blue light wavelengths pass through the upper polarizing film 32 in different light amounts depending on the degree to which they have been phase-changed in the liquid crystal layer 30. The light amount passing through the upper polarizing film 32 may be controlled by adjusting a voltage applied to each pixel electrode 12, and thus each red, green, and blue light amount passing through the upper polarizing film 32 may be independently controlled. The liquid crystal display (LCD) may display a color image through this process. Herein, the color region displayed by the liquid crystal display (LCD) is dependent upon color purities of the red, green, and blue components included in the white light source supplied by the backlight unit 200. In other words, since the red, green, and blue lights extracted by filtering the white light supplied by the backlight unit 200 through the color filter 23 are used to display an image, the liquid crystal display (LCD) may display various colors and thus express a large color gamut in color coordinates when the red, green, and blue lights included in the white light have a high level of color purity.

A display device according to an embodiment may display a triangle-shaped color gamut where, based on xy color coordinates of the white light, a red apex may be positioned in the region of 0.66<Cx<0.70 and 0.28<Cy<0.33, a green apex may be positioned in the region of 0.19<Cx<0.22 and 0.70<Cy<0.72, and a blue apex may be positioned in the region of 0.14<Cx<0.15 and 0.04<Cy<0.05. In another embodiment, a red apex may be positioned in the region of 0.660<Cx<0.700 and 0.290<Cy<0.320 and a green apex may be positioned in the region of 0.200<Cx<0.215 and 0.700<Cy<0.720, based on xy color coordinates of the white light. In another embodiment, a red apex may be positioned in the region of 0.671<Cx<0.696 and 0.299<Cy<0.314 and a green apex may be positioned in the region of 0.205<Cx<0.210 and 0.712<Cy<0.718, based on xy color coordinates of the white light. Such a triangle-shaped color gamut may coincide with the Adobe RGB color gamut at a rate of about 99.0%, for example about 99.7%, or for example about 100.0%.

The white light supplied by the backlight unit 200 includes a red light component, a green light component, and a blue light component, each having a color purity capable of expressing the triangle color gamut defined above. The above-defined triangle color gamut may be drawn by passing the white light supplied by the backlight unit 200 through a red filter to extract a red component, passing it through a green filter to extract a green component, and passing it through a blue filter to extract a blue component, and then connecting each apex corresponding to each color component in xy color coordinates. When the backlight unit 200 is combined with the liquid crystal panel 100 to build a liquid crystal display (LCD), the color filter 23 formed in the liquid crystal panel 100 is used to measure each color spectrum. In other words, a red spectrum may be obtained by turning on a red pixel but turning off the rest of the pixels in the liquid crystal display (LCD), a green spectrum may be obtained by turning on a green pixel but turning off the rest of the pixels in the liquid crystal display (LCD), and a blue spectrum may be obtained by turning on a blue pixel but turning off the rest of the pixels in the liquid crystal display (LCD). Alternatively, the position of each color component in color coordinates may be calculated by measuring the spectrum of white light emitted by the backlight unit 200 using a spectroscope and determining the peak and the full width at half maximum (FWHM) of the spectrum.

Herein, a blue component (e.g. light having a wavelength corresponding to a blue region in the visible color spectrum) may be emitted by a blue light emitting diode, and the blue component is determined by characteristics of the blue light emitting diode and may have no room for change. Accordingly, only the characteristics of red and green components may be considered in an exemplary embodiment.

The white light including a red light component, a green light component, and a blue light component, each having a color purity configured to display the triangle-shaped color gamut defined above, is supplied by the backlight unit 200 including a light emitting element and a light conversion layer. The light conversion layer is configured to convert light emitted from the light emitting element into white light, and the light conversion layer includes a matrix resin and a quantum dot. The white light supplied by the backlight unit 200 may include a green light component having a peak wavelength of about 525 nm to about 528 nm, and a FWHM of less than or equal to about 40 nm, for example about 20 nm to about 40 nm, and a red light component having a peak wavelength of about 625 nm to about 645 nm.

Herein, the red light component may have a FWHM of less than or equal to about 50 nm, for example about 40 nm to about 48 nm, which is desirable in terms of optimal display luminance.

In this case, the white light may include a red light component, a green light component, and a blue light component each having a color purity configured to display a color gamut having a concordance rate of greater than or equal to about 99.7% with an Adobe RGB color gamut of a display device. The white light may include a green light component having a peak wavelength of about 526 nm to about 528 nm and a FWHM of less than or equal to about 40 nm, and a red light component having a peak wavelength of about 635 nm to about 645 nm. In this case, the white light may include a red light component, a green light component, and a blue light component each having a color purity configured to display a color gamut having a concordance rate of about 100.0% with an Adobe RGB color gamut of a display device.

The red light component may have a FWHM of less than or equal to about 50 nm.

The light emitted from the light emitting element may have a peak wavelength of about 445 nm to about 455 nm and a FWHM of less than or equal to about 45 nm.

A red apex may be positioned in the region of 0.66<Cx<0.70 and 0.28<Cy<0.33 and a green apex may be positioned in the region of 0.19<Cx<0.22 and 0.70<Cy<0.72, based on xy color coordinates of the white light. In an embodiment, a red apex may be positioned in the region of 0.660<Cx<0.700 and 0.290<Cy<0.320 and a green apex may be positioned in the region of 0.200<Cx<0.215 and 0.700<Cy<0.720, based on xy color coordinates of the white light. In an embodiment, a red apex may be positioned in the region of 0.671<Cx<0.696 and 0.299<Cy<0.314 and a green apex may be positioned in the region of 0.205<Cx<0.210 and 0.712<Cy<0.718, based on xy color coordinates of the white light.

The white light may have a ratio ($O_h/G_h$) of less than or equal to about 0.15, for example less than or equal to about 0.12, or for example about 0.08 to about 0.15, wherein $O_h$ is a height of a peak wavelength of the green light component overlapping a wavelength of the red light component, and $G_h$ is a height of a peak wavelength of the green light component.

The white light may have a ratio ($O_h/R_h$) of less than or equal to about 0.20, for example less than or equal to about 0.18, or for example less than or equal to about 0.12, or for example about 0.10 to about 0.18, wherein $O_h$ is a height of a peak wavelength of the green light component overlapping a wavelength of the red light component, and $R_h$ is a height of a peak wavelength of the red light component.

When ratios of the peak wavelength heights are controlled to be within the above-described ranges, color reproducibility of a display device may be improved. When the white light supplied by the backlight unit 200 passes through the color filter 23, a position of a peak wavelength does not change and a spectrum having a FWHM reduced by about 3 nm or less is shown. That is, a color spectrum of light emitted by the backlight unit 200 and a color spectrum of light after passing through the color filter 23, maintain positions of the peak wavelengths without any change. For example, the white light including a green light component having a peak wavelength of about 525 nm to about 528 nm and a full width at half maximum (FWHM) of less than or equal to about 40 nm, and a red light component having a peak wavelength of about 625 nm to about 645 nm and a FWHM of less than or equal to about 50 nm, after passing through the color filter 23, may provide a green light component having a peak wavelength of about 525 nm to about 528 nm and a FWHM of less than or equal to about 38 nm, and a red light component having a peak wavelength of about 625 nm to about 645 nm and a FWHM of less than or equal to about 49 nm after passing a color filter. Thereby, a white light color spectrum emitted from a backlight unit may be controlled and thus a white light color spectrum of a liquid crystal display (LCD) may be controlled.

After passing through color filters 23, the white light may have a percentage of areas ($S_{G+R}$) of a green peak and a red peak relative to an entire area ($A_B$) of a blue peak in a blue spectrum, of less than or equal to about 10%. After passing through color filters 23, the white light may have a percentage of a blue peak relative to an entire area ($A_G$) of a blue peak in a green spectrum, of less than or equal to about 1% of an area ($S_B$). After passing through color filters 23, the white light may have a percentage of areas ($S_{B+G}$) of a blue peak and a green peak relative to an entire area ($A_R$) of a blue peak in a red spectrum, of less than or equal to about 0.5%. When the white light has a spectrum having an area percentage within the range, color reproducibility of a display device may be improved.

A color temperature of the white light may be about 5,000 Kelvin (K) to about 8,000 K.

The backlight unit 200 of the liquid crystal display (LCD) is described in detail.

Figure 2:
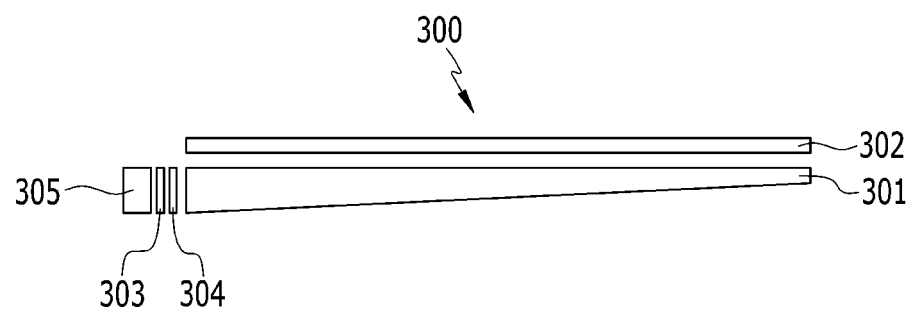
FIGS. 2 to 4 are cross-sectional views showing edge-type backlight units according to various embodiments.
Figure 3:
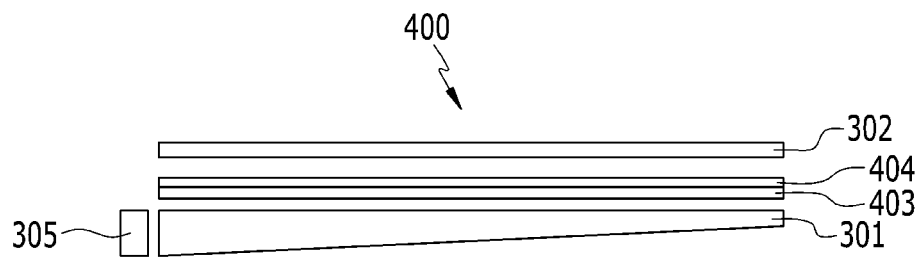
Figure 4:
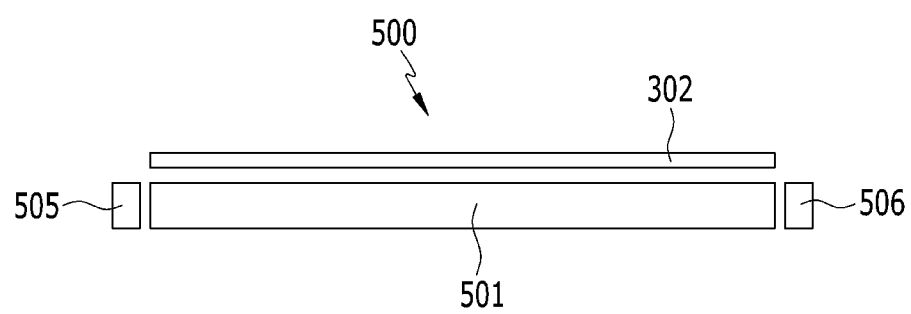

FIGS. 2 to 4 are cross-sectional views showing edge-type backlight units according to various embodiments. Referring to FIG. 2, a backlight unit 300 according to an embodiment includes a wedge-shaped light guide 301, a light diffusion plate 302 disposed on the light guide 301, a light emitting element 305 disposed at one side of the light guide 301, and light conversion layers 303 and 304 interposed between the light emitting element 305 and the light guide 301.

The light guide 301 is a transparent wedge-shaped quadrangle plate which becomes gradually thinner from one side to the opposite side, and plays a role of transforming line light into surface light. The diffusion plate 302 plays a role of scattering the surface light emitted from the light guide 301 and uniformly spreading the scattered light. The light emitting element 305 may be a plurality of blue light emitting diodes arranged in a single line. The light conversion layers 303 and 304 each include a quantum dot, and receive blue light emitted from the blue light emitting diode. A portion of the blue light received by the light conversion layers 303 and 304 is converted each of green light and red light to emit white light. The two light conversion layers 303 and 304 may be separated so that one may convert blue light into green light and the other may convert blue light into red light, or alternatively, each of the two light conversion layers 303 and 304 may include a quantum dot which converts blue light into green light as well as a quantum dot which converts blue light into red light. In addition, the two light conversion layers 303 and 304 are attached to each other to be integrally formed, and may form a light conversion layer in a form of a single layer including a quantum dot to convert blue light into green light and a quantum dot to convert blue light into red light. The light conversion layers 303 and 304 may be films formed by mixing a quantum dot with a resin, and may further include a scattering particle such as silica and the like, or an auxiliary component to improve optical properties.

The quantum dot may be a cadmium (Cd) free quantum dot. For example, the quantum dot does not include cadmium. The cadmium free quantum dot may include a Group II-VI semiconductor nanocrystal such as ZnS, ZnSe, ZnTe, HgS, HgSe, HgTe, ZnSeS, ZnSeTe, ZnSTe, HgSeS, HgSeTe, HgSTe, HgZnS, HgZnSe, HgZnTe, HgZnSeS, HgZnSeTe, and HgZnSTe; a Group III-V semiconductor nanocrystal such as GaN, GaP, GaAs, AlN, AlP, AlAs, InN, InP, InZnP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs; a Group IV-IV semiconductor nanocrystal such as SbTe; or a combination thereof.

The quantum dot may have a core-shell structure. For example, the quantum dot may include a core including InP, InZnP, or a combination thereof and a shell including ZnSe, ZnS, or a combination thereof. The quantum dot may be included in an amount of less than or equal to about 5 weight percent (wt %), based on the total weight of the light conversion layers 303 and 304.

The quantum dot may be dispersed in a matrix resin, for example a matrix resin including a silicone resin, an epoxy resin, a (meth)acrylate resin, or the like, or a combination thereof. The scattering particle may include ZnO, $Al_2O_3$, ZrO, or the like, or a combination thereof, and may be included in an amount of about 10 wt % based on the total weight of the light conversion layer 303 and 304.

Referring to FIG. 3, the backlight unit 400 according to an embodiment includes a wedge-shaped light guide 301, a light diffusion plate 302 disposed on the light guide 301, a light emitting element 305 disposed at a side of the light guide 301, and light conversion layers 403 and 404 interposed between the light guide 301 and the light diffusion plate 302. Compared with the embodiment of FIG. 2, the light conversion layers 403 and 404 are disposed between the light guide 301 and the light diffusion plate 302 in the embodiment of FIG. 3. The light conversion layers 403 and 404 may also be disposed on the diffusion plate 302. The structure, components, and quantum dots of the light conversion layers 403 and 404 may be the same as the structure, components, and quantum dot of the light conversion layers 303 and 304 in FIG. 2.

Referring to FIG. 4, the backlight unit 500 according to an embodiment may include a light guide 501 having a uniform thickness and having a shape of a transparent quadrangle plate, a light diffusion plate 302 disposed on the light guide 501, and a light emitting element 505 disposed on a first side of the light guide 506 and a light emitting element 506 disposed on an opposite second side of the light guide 501. Alternatively, the light emitting elements 505 and 506 to emit white light may each be disposed at one of the first side or the second side of the light guide 301, similar to the configuration shown in FIGS. 2 and 3.

The light emitting elements 505 and 506 include a blue light emitting chip to emit blue light, and a light conversion layer covering the blue light emitting chip. The light conversion layer covering the blue light emitting chip includes a quantum dot capable of converting blue light into green light and red light. Accordingly, the light emitting elements 505 and 506 emit white light.

As shown in FIG. 4, when the light emitting elements 505 and 506 to emit white light are used, the light conversion layers 303, 304, 403, and 404 may be omitted.

Figure 5:
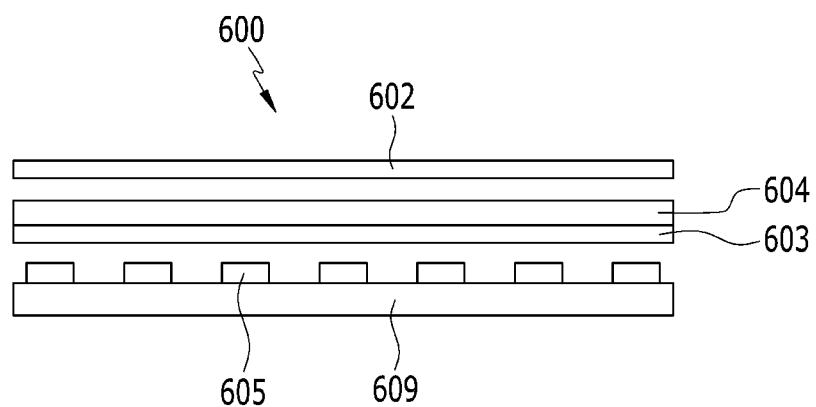
FIGS. 5 and 6 are cross-sectional views showing direct-type backlight units according to various embodiments.
Figure 6:
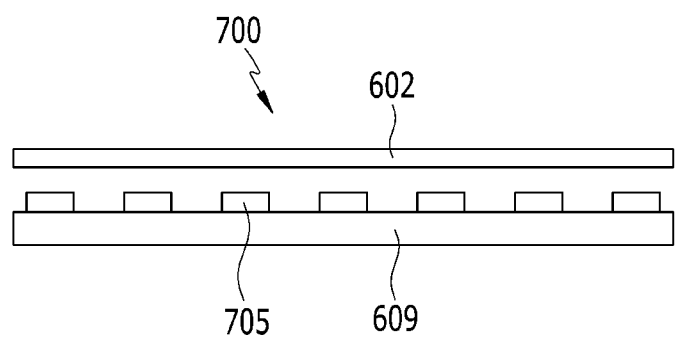

The backlight unit may be a direct-type backlight unit, and FIGS. 5 and 6 are cross-sectional views of direct-type backlight units according to various embodiments.

Referring to FIG. 5, a backlight unit 600 includes a plurality of blue light emitting elements 605 disposed on a substrate 609 such as a PCB (printed circuit board), and spaced apart from each other at a pre-determined interval. Light conversion layers 603 and 604 to convert blue light into white light, are disposed on the light emitting elements 605. A diffusion plate 602 may be disposed on the light conversion layers 603 and 604. The two light conversion layers 603 and 604 may include quantum dots which are different from each so that one light conversion layer may convert blue light into green light and the other may convert blue light into red light, or alternatively, each of the two light conversion layers 603 and 604 may include both a quantum dot to convert blue light into green light and a quantum dot to convert blue light into red light.

In addition, the two light conversion layers 603 and 604 are attached to each other to be integrally formed, and may form a light conversion layer in a form of a single layer including a quantum dot to convert blue light into green light and a quantum dot to convert blue light into red light. The light conversion layers 603 and 604 may be formed by mixing a quantum dot with a resin, and may further include a scattering or an auxiliary component to improve optical properties. The quantum dot or the scattering particle are the same as described above.

Referring to FIG. 6, a backlight unit 700 includes a plurality of white light emitting elements 705 disposed on a substrate 609 such as a PCB (printed circuit board), and spaced apart from each other at a pre-determined interval. A diffusion plate 602 is disposed on the light emitting element 705.

The white light emitted from the light conversion layer may include a green light component having a peak wavelength of about 525 nm to about 528 nm, a FWHM of less than or equal to about 40 nm, and a red light component having a peak wavelength of about 625 nm to about 645 nm. In this case, the white light may include a red light component, a green light component, and a blue light component each having a color purity configured to display a color gamut having a concordance rate of greater than or equal to about 99.0%, for example greater than or equal to about 99.7%, with an Adobe RGB color gamut of a display device.

In an embodiment, the white light may include a green light component having a peak wavelength of about 526 nm to about 528 nm, for example about 526 nm to about 527 nm, and a FWHM of less than or equal to about 38 nm, and a red light component having a peak wavelength of about 635 nm to about 645 nm. In this case, the white light may include a red light component, a green light component, and a blue light component each having a color purity configured to display a color gamut having a concordance rate of about 100.0% with an Adobe RGB color gamut of a display device.

A red apex may be positioned in the region of 0.66<Cx<0.70 and 0.28<Cy<0.33 and a green apex may be positioned in the region of 0.19<Cx<0.22 and 0.70<Cy<0.72, based on xy color coordinates of the white light.

In an embodiment, a red apex may be positioned in the region of 0.660<Cx<0.700 and 0.290<Cy<0.320 and a green apex may be positioned in the region of 0.200<Cx<0.215 and 0.700<Cy<0.720, based on xy color coordinates of the white light. In an embodiment, a red apex may be positioned in the region of 0.671<Cx<0.696 and 0.299<Cy<0.314 and a green apex may be positioned in the region of 0.205<Cx<0.210 and 0.712<Cy<0.718, based on xy color coordinates of the white light.

The white light may have a ratio $(O_h/G_h)$ of less than or equal to about 0.15, for example less than or equal to about 0.12, or for example for example about 0.08 to about 0.15, wherein $O_h$ is a height of a peak wavelength of the green light component overlapping a wavelength of the red light component and $G_h$ is a height of a peak wavelength of the green light component. Within the above ranges, a light source and a backlight unit having color reproducibility may be provided.

The white light may have a ratio $(O_h/R_h)$ of less than or equal to about 0.20, for example less than or equal to about 0.18, for example less than or equal to about 0.12, or for example about 0.10 to about 0.18, wherein $O_h$ is a height of a peak wavelength of the green light component overlapping a wavelength of the red light component and $R_h$ is a height of a peak wavelength of the red light component.

Figure 7:
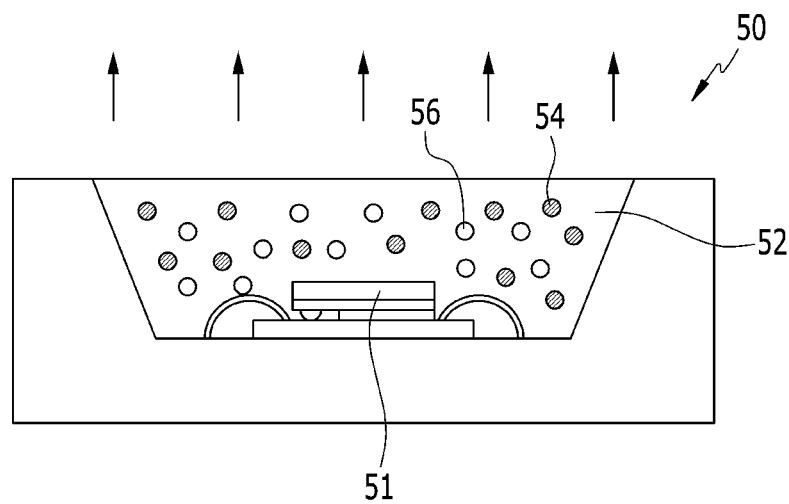
FIGS. 7 to 9 are cross-sectional views of light emitting elements according to various embodiments.
Figure 8:
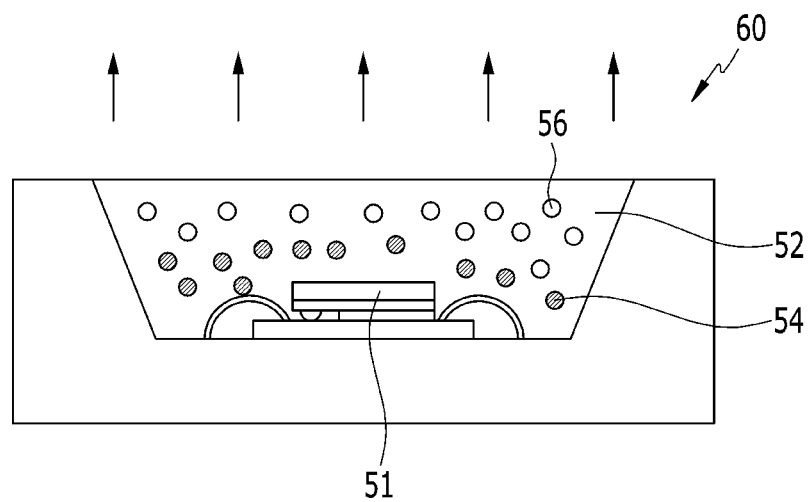
Figure 9:
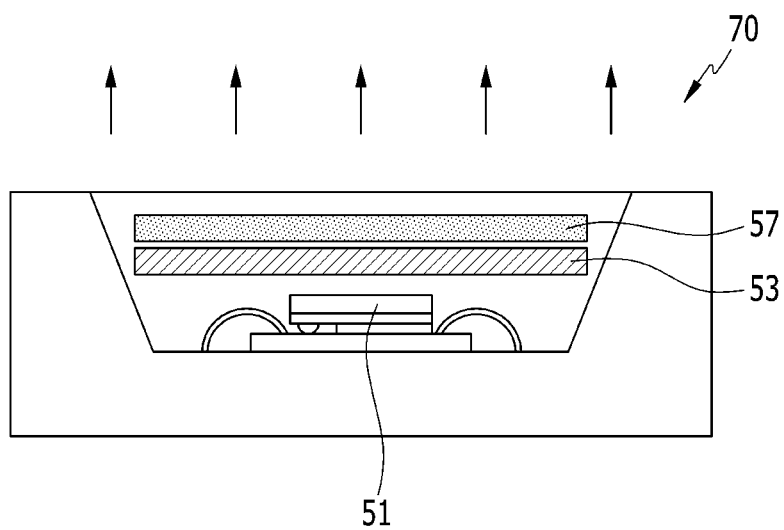

The light emitting elements to emit white light of FIGS. 2 to 6 are described referring to FIGS. 7 to 9 in detail. FIGS. 7 to 9 are cross-sectional views of light emitting elements according to various embodiments.

Referring to FIG. 7, a white light emitting element 50 according to an embodiment includes a light emitting diode chip 51 emitting blue light, and a light conversion layer 52 covering the light emitting diode chip 51. The light conversion layer 52 may be formed by mixing a quantum dot 54, which converts blue light into green light, and a quantum dot 56, which converts blue light into red light, with a matrix resin and applying the mixture. The mixture may further include a scattering particle such as silica, or an auxiliary component to improve optical properties.

The quantum dot may be a cadmium (Cd) free quantum dot, and thus the quantum dot may not include cadmium. The cadmium free quantum dot may be a Group II-VI semiconductor nanocrystal such as ZnS, ZnSe, ZnTe, HgS, HgSe, HgTe, ZnSeS, ZnSeTe, ZnSTe, HgSeS, HgSeTe, HgSTe, HgZnS, HgZnSe, HgZnTe, HgZnSeS, HgZnSeTe, and HgZnSTe; a Group III-V semiconductor nanocrystal such as GaN, GaP, GaAs, AlN, AlP, AlAs, InN, InP, InZnP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs, or a Group IV-IV semiconductor nanocrystal such as SbTe.

The quantum dot may have a core-shell structure. For example, the quantum dot may be a quantum dot including a core selected from InP, InZnP, or a combination thereof, and a shell including ZnSe, ZnS, or a combination thereof. The quantum dot may be included in an amount of less than or equal to about 5 wt %, based on the total weight of the light conversion layer 52.

The quantum dot may be dispersed in a matrix resin, for example a matrix resin including a silicone resin, an epoxy resin, a (meth)acrylate resin, or the like, or a combination thereof. The scattering particle may include ZnO, $Al_2O_3$, ZrO, or the like, or a combination thereof, and may be included in an amount of about 10 wt % based on the total weight of the light conversion layer 52.

Referring to FIG. 8, a white light emitting element 60 according to an embodiment includes a light emitting diode chip 51 emitting blue light and a light conversion layer 52 covering the light emitting diode chip 51. The light conversion layer 52 may be formed by mixing a quantum dot 54, which converts blue light into green light, and a quantum dot 56, which converts blue light into red light, with a matrix resin and applying the mixture. The mixture may further include a scattering particle such as silica or an auxiliary component to improve optical properties. The quantum dot and the scattering particle are the same as described in the embodiment of FIG. 7.

In the embodiment of FIG. 8, the quantum dot 54 which converts blue light into green light is applied first, and the quantum dot 56 which converts blue light into red light is applied thereafter, and thereby different layers are formed including different quantum dots, which is different from the embodiment in FIG. 7. Alternatively, the quantum dot 56, which converts blue light into red light, may be applied first, and the quantum dot 54 which converts blue light into green light, may be applied thereafter.

Referring to FIG. 9, a white light emitting element 70 according to an embodiment includes a light conversion layer including a quantum dot film 53 to convert blue light into green light and a quantum dot film 57 to convert blue light into red light on a light emitting diode chip 51. The positions of the quantum dot film 53 to convert blue light into green light and the quantum dot film 57 to convert blue light into red light, may be exchanged with each other, and may be alternatively formed as a single film including both a quantum dot to convert blue light into red light and a quantum dot to convert blue light into green light. The structure, components, and quantum dots of the quantum dot films 53 and 57 may be the same as the structure, components, and quantum dots of the light conversion layer 52. The white light emitted supplied by the light emitting element (light source) may include a green light component having a peak wavelength of about 525 nm to about 528 nm and a FWHM of less than or equal to about 40 nm, and a red light component having a peak wavelength of about 625 nm to about 645 nm. In this case, the white light may include a red light component, a green light component, and a blue light component each having a color purity configured to display a color gamut having a concordance rate of greater than or equal to about 99.0%, for example greater than or equal to about 99.7%, with an Adobe RGB color gamut of a display device.

In an embodiment, the white light may include a green light component having a peak wavelength of about 526 nm to about 528 nm, for example about 526 nm to about 527 nm, a FWHM of less than or equal to about 38 nm, and a red light component having a peak wavelength of about 635 nm to about 645 nm. In this case, the white light may include a red light component, a green light component, and a blue light component each having a color purity configured to display a color gamut having a concordance rate of about 100% with an Adobe RGB color gamut of a display device.

A red apex may be positioned in the region of 0.66<Cx<0.70 and 0.28<Cy<0.33 and a green apex may be positioned in the region of 0.19<Cx<0.22 and 0.70<Cy<0.72, based on xy color coordinates of the white light. In another embodiment, a red apex may be positioned in the region of 0.660<Cx<0.700 and 0.290<Cy<0.320 and a green apex may be positioned in the region of 0.200<Cx<0.215 and 0.700<Cy<0.720, based on xy color coordinates of the white light.

In another embodiment, a red apex may be positioned in the region of 0.671<Cx<0.696 and 0.299<Cy<0.314 and a green apex may be positioned in the region of 0.205<Cx<0.210 and 0.712<Cy<0.718, based on xy color coordinates of the white light.

The white light may have a ratio ($O_h/G_h$) of less than or equal to about 0.15, for example less than or equal to about 0.12, or for example about 0.08 to about 0.15, wherein $O_h$ is a height of a peak wavelength of the green light component overlapping a wavelength of the red light component and $G_h$ is a height of a peak wavelength of the green light component. Within the above ranges, a display device having color reproducibility may be provided.

The white light may have a ratio ($O_h/R_h$) of less than or equal to about 0.20, for example less than or equal to about 0.18, for example less than or equal to about 0.12, or for example about 0.10 to about 0.18, wherein $O_h$ is a height of a peak wavelength of the green light component overlapping a wavelength of the red light component and $R_h$ is a height of a peak wavelength of the red light component. Within the above ranges, a display device having color reproducibility may be provided.

The white light emitted from the light source and the backlight unit is combined with the liquid crystal panel and separated into red, green, and blue components, and a red apex is positioned in the region of in the region of 0.66<Cx<0.70 and 0.28<Cy<0.33 and a green apex is positioned in the region of 0.19<Cx<0.22 and 0.70<Cy<0.72, based on xy color coordinates of the white light.

In another embodiment, a red apex may be positioned in the region of 0.660<Cx<0.700 and 0.290<Cy<0.320 and a green apex may be positioned in the region of 0.200<Cx<0.215 and 0.700<Cy<0.720, based on xy color coordinates of the white light.

In another embodiment, a red apex may be positioned in the region of 0.671<Cx<0.696 and 0.299<Cy<0.314 and a green apex may be positioned in the region of 0.205<Cx<0.210 and 0.712<Cy<0.718, based on xy color coordinates of the white light.

The white light consists of clearly distinguished blue, green, and red spectra and has a small difference in terms of wavelength and full width at half maximum (FWHM) before and after passing through the liquid crystal display panel. The wavelengths and the FWHM may be measured using the color filter of a general liquid crystal display such as a TV and a monitor, and is calculated using light passing through the color filter.

Hereinafter, the present disclosure is illustrated in more detail with reference to examples. However, these examples are exemplary, and the present disclosure is not limited thereto.

EXAMPLES

Each backlight unit according to Examples 1 to 8 and Comparative Examples 1 to 5 is manufactured using a light emitting diode emitting blue light having a peak position of 445 nm and a FWHM of 18 nm, and by positioning a light conversion layer in a form of a film manufactured by mixing 5 wt % of quantum dot (InP core coated with ZnS) and 95 wt % of an acrylate resin on the light emitting diode so as to have the light spectra emitted from backlight unit of Table 1.

The manufactured backlight units are combined with a liquid crystal panel to manufacture each liquid crystal display (LCD).

Peak wavelengths and FWHMs of a green light component and a red light component of white light spectra emitted from the backlight units according to Examples 1 to 6 and Comparative Examples 1 to 5, and peak wavelengths and FWHMs of a green wavelength and a red wavelength of white light spectra after passing a color filter of a liquid crystal display (LCD), are shown in Table 1.

TABLE 1

| | White light spectra emitted from backlight unit | | | | White light spectra after passing a color filter of a liquid crystal display (LCD) | | | |
|---|---|---|---|---|---|---|---|---|
| Light conversion layer | Green wavelength (nm) | Green wavelength FWHM (nm) | Red wavelength (nm) | Red wavelength FWHM (nm) | Green wavelength (nm) | Green wavelength FWHM (nm) | Red wavelength (nm) | Red wavelength FWHM (nm) |
| Example 1 | 527 | 38 | 641 | 48 | 527 | 38 | 642 | 46 |
| Example 2 | 528 | 38 | 636 | 45 | 526 | 35 | 635 | 45 |
| Example 3 | 527 | 39 | 637 | 45 | 526 | 36 | 635 | 45 |
| Example 4 | 527 | 40 | 640 | 48 | 527 | 38 | 638 | 46 |
| Example 5 | 525 | 39 | 635 | 49 | 525 | 37 | 632 | 48 |
| Example 6 | 528 | 37 | 639 | 50 | 528 | 33 | 637 | 49 |
| Comparative Example 1 | 524 | 41 | 636 | 51 | 524 | 40 | 636 | 47 |
| Comparative Example 2 | 531 | 37 | 637 | 50 | 532 | 33 | 635 | 46 |
| Comparative Example 3 | 532 | 39 | 639 | 53 | 531 | 34 | 637 | 49 |
| Comparative Example 4 | 530 | 38 | 637 | 50 | 530 | 38 | 636 | 48 |
| Comparative Example 5 | 529 | 40 | 640 | 50 | 529 | 40 | 636 | 48 |

As shown in Table 1, comparing the white light spectra emitted from the backlight units of Examples 1 to 6 and Comparative Examples 1 to 5 with the white light spectra after the light has passed through a color filter of a liquid crystal display (LCD), positions of peak wavelengths are not changed.

The luminance, color coordinates and Adobe RGB color coordinate concordance rates of liquid crystal displays (LCDs) are calculated and are shown in Table 2.

TABLE 2

| Light conversion layer | Luminance (lm) | Green color coordinate (Cx, Cy) | Red color coordinate (Cx, Cy) | Adobe RGB color coordinate concordance rate (%) |
|---|---|---|---|---|
| Example 1 | 376.85 | (0.2054, 0.7184) | (0.6967, 0.2993) | 100.0 |
| Example 2 | 447.02 | (0.2061, 0.7163) | (0.6781, 0.3088) | 100.0 |
| Example 3 | 375.71 | (0.2041, 0.7155) | (0.6778, 0.3091) | 100.0 |
| Example 4 | 376.85 | (0.2054, 0.7184) | (0.6967, 0.2993) | 100.0 |
| Example 5 | 444.36 | (0.2009, 0.7121) | (0.6715, 0.3169) | 99.8 |
| Example 6 | 323.26 | (0.2103, 0.7120) | (0.6712, 0.3146) | 100.0 |
| Comparative Example 1 | 303.47 | (0.1973, 0.7055) | (0.6664, 0.3159) | 98.6 |
| Comparative Example 2 | 348.97 | (0.2079, 0.7264) | (0.6418, 0.3170) | 98.7 |
| Comparative Example 3 | 321.37 | (0.2281, 0.7053) | (0.6671, 0.3197) | 96.3 |
| Comparative Example 4 | 349.55 | (0.2176, 0.7112) | (0.6695, 0.3167) | 98.6 |
| Comparative Example 5 | 271.78 | (0.2158, 0.7021) | (0.6696, 0.3151) | 98.6 |

Referring to Table 2, when a peak wavelength of the green light component is between about 525 nm and about 528 nm and a FWHM is less than or equal to 40 nm, and a peak wavelength of the red light component is between about 625 nm and about 645 nm, an Adobe RGB color coordinate concordance rate is greater than or equal to 99.8%. Particularly, when a peak wavelength of the green light component is between about 526 nm and about 528 nm and a FWHM is less than or equal to 40 nm, and a peak wavelength of the red light component is between about 635 nm and about 645 nm, an Adobe RGB color coordinate concordance rate is 100%.

Adobe RGB color coordinate concordance rates are evaluated according to a ratio $(O_h/G_h)$ wherein $O_h$ is a height of a peak wavelength of the green light component overlapping a wavelength of the red light component and $G_h$ is a height of a peak wavelength of the green light component, and a ratio $(O_h/R_h)$ wherein $O_h$ is a height of a peak wavelength of the green light component overlapping a wavelength of the red light component, and $R_h$ is a height of a peak wavelength of the red light component of white light of liquid crystal displays (LCDs) including the light conversion layer. The results are shown in Table 3. In Table 3, a height of each peak wavelength indicates spectrum intensity and is expressed as an arbitrary unit.

TABLE 3

| | $G_h$ | $O_h$ | $R_h$ | $O_h/G_h$ | $O_h/R_h$ | Adobe RGB color coordinate concordance rate (%) |
|---|---|---|---|---|---|---|
| Example 1 | 0.1260 | 0.0122 | 0.1250 | 0.097 | 0.098 | 100.0 |
| Example 3 | 0.1390 | 0.0137 | 0.1250 | 0.099 | 0.110 | 100.0 |
| Example 5 | 0.1200 | 0.0173 | 0.1010 | 0.144 | 0.171 | 99.8 |
| Example 6 | 0.1280 | 0.0130 | 0.1160 | 0.102 | 0.112 | 100.0 |
| Comparative Example 2 | 0.1110 | 0.188 | 0.0856 | 0.169 | 0.220 | 98.7 |
| Comparative Example 3 | 0.1100 | 0.0187 | 0.0774 | 0.170 | 0.242 | 96.3 |

Referring to Table 3, when the ratio $(O_h/G_h)$ is less than or equal to about 0.15 and the ratio $(O_h/R_h)$ is less than or equal to about 0.20, Adobe RGB color coordinate concordance rates increase.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A display device comprising:
a plurality of color filters; and a light source comprising a light emitting element and a light conversion layer configured to convert light emitted from the light emitting element into white light,
wherein the light conversion layer comprises a matrix resin and a quantum dot having a core-shell structure,
wherein the white light comprises a red light component, a green light component, and a blue light component,
wherein the green light component has a peak wavelength of 525 nanometers to 528 nanometers and a full width at half maximum of less than or equal to 40 nanometers, and the red light component has a peak wavelength of 625 nanometers to 645 nanometers, and
wherein a change of the full width at half maximum of the green light component and the red light component after the white light passing through the color filters is less than or equal to 3 nanometers.

2. The display device of claim 1, wherein the white light includes the green light component having a peak wavelength of 526 nanometers to 528 nanometers and a full width at half maximum of less than or equal to 40 nanometers and the red light component has a peak wavelength of 635 nanometers to 645 nanometers, and
the red light component, the green light component, and the blue light component each have a color purity configured to display a color gamut having a concordance rate of about 100.0% with an Adobe RGB color gamut of a display device.

3. The display device of claim 1, wherein the red light component has a full width at half maximum of less than or equal to 50 nanometers.

4. The display device of claim 1, wherein light emitted from the light emitting element has a peak wavelength of about 445 nanometers to about 455 nanometers and a full width at half maximum of less than or equal to about 45 nanometers.

5. The display device of claim 1, wherein a red apex is positioned in a region of $0.66<Cx<0.70$ and $0.28<Cy<0.33$, and a green apex is positioned in a region of $0.19<Cx<0.22$ and $0.70<Cy<0.72$, based on xy color coordinates of the white light.

6. The display device of claim 5, wherein the red apex is positioned in the region of $0.660<Cx<0.700$ and $0.290<Cy<0.320$ and a green apex is positioned in the region of $0.200<Cx<0.215$ and $0.700<Cy<0.720$, based on xy color coordinates of the white light.

7. The display device of claim 1, wherein the white light has a ratio of a height of a peak wavelength of the green light component overlapping a wavelength of the red light component to a height of the peak wavelength of the green light component, which is less than or equal to about 0.15.

8. The display device of claim 7, wherein the ratio is less than or equal to about 0.12.

9. The display device of claim 1, wherein the white light has a ratio of a height of a peak wavelength of the green light component overlapping a wavelength of the red light component to a height of the peak wavelength of the red light component, which is less than or equal to about 0.20.

10. The display device of claim 9, wherein the ratio is less than or equal to about 0.12.

11. The display device of claim 1, wherein the quantum dot does not comprise cadmium.

12. The display device of claim 11, wherein the quantum dot comprises a Group II-VI semiconductor nanocrystal selected from ZnS, ZnSe, ZnTe, HgS, HgSe, HgTe, ZnSeS, ZnSeTe, ZnSTe, HgSeS, HgSeTe, HgSTe, HgZnS, HgZnSe, HgZnTe, HgZnSeS, HgZnSeTe, and HgZnSTe; a Group III-V semiconductor nanocrystal selected from GaN, GaP, GaAs, AlN, AlP, AlAs, InN, InP, InZnP, InAs, GaNP, GaNAs, GaPAs, AlNP, AlNAs, AlPAs, InNP, InNAs, InNAs, GaAlNP, GaAlNAs, GaAlPAs, GaInNP, GaInNAs, GaInPAs, InAlNP, InAlNAs, and InAlPAs; a Group IV-IV semiconductor nanocrystal selected from SbTe; or a combination thereof.

13. The display device of claim 1, wherein the quantum dot comprises a core comprising InP, InZnP, or a combination thereof, and a shell comprising ZnSe, ZnS, or a combination thereof.

14. The display device of claim 1, wherein the display device comprises a liquid crystal panel comprising the color filters.

15. The display device of claim 14, wherein after passing through the plurality of color filters, the white light has a percentage of areas of a green peak and a red peak relative to an entire area of a blue peak in a blue spectrum of less than or equal to about 10%.

16. The display device of claim 14, wherein after passing through the plurality of color filters, the white light has a percentage of an area of a blue peak relative to an entire area of a blue peak in a green spectrum of less than or equal to about 1%.

17. The display device of claim 14, wherein after passing through the plurality of color filters, the white light has a percentage of a blue peak and a green peak of less than or equal to about 0.5% of areas relative to an entire area ($A_R$) of a blue peak in a red spectrum.

18. A backlight unit, comprising:
a light emitting element;
a light conversion layer configured to convert light emitted from the light emitting element into white light; and
an optical film on the light conversion layer,
wherein the light conversion layer comprises a matrix resin and a quantum dot having a core-shell structure,
wherein the white light comprises a red light component, a green light component, and a blue light component,
wherein the green light component has a peak wavelength of 525 nanometers to 528 nanometers and a full width at half maximum of less than or equal to 40 nanometers, and the red light component has a peak wavelength of 625 nanometers to 645 nanometers, and
wherein a red apex is positioned in a region of $0.66<Cx<0.70$ and $0.28<Cy<0.33$, and a green apex is positioned in a region of $0.19<Cx<0.22$ and $0.70<Cy<0.72$, based on xy color coordinates of the white light.

19. The backlight unit of claim 18, wherein the white light includes the green light component having a peak wavelength of 526 nanometers to 528 nanometers and a full width at half maximum of less than or equal to 40 nanometers, and the red light component has a peak wavelength of 635 nanometers to 645 nanometers, and
the red light component, the green light component, and the blue light component each have a color purity configured to display a color gamut having a concordance rate of about 100.0% with an Adobe RGB color gamut of a display device.

20. The backlight unit of claim 18, wherein the red light component has a full width at half maximum of less than or equal to 50 nanometers.

21. The backlight unit of claim 18, wherein light emitted from the light emitting element has a peak wavelength of about 445 nanometers to about 455 nanometers and a full width at half maximum of less than or equal to about 45 nanometers.

22. The backlight unit of claim 18, wherein the white light has a ratio of a height of a peak wavelength of the green light component overlapping a wavelength of the red light component to a height of a peak wavelength of the green light component, which is less than or equal to about 0.15.

23. The backlight unit of claim 22, wherein the ratio is less than or equal to about 0.12.

24. The backlight unit of claim 18, wherein the white light has a ratio of a height of a peak wavelength of the green light component overlapping a wavelength of the red light component to a height of a peak wavelength of the red light component, which is less than or equal to about 0.20.

25. The backlight unit of claim 24 wherein the ratio is less than or equal to about 0.12.

26. The backlight unit of claim 18, wherein the quantum dot does not comprise cadmium.

27. The backlight unit of claim 26, wherein the quantum dot is a Group II-VI semiconductor nanocrystal selected from ZnS, ZnSe, ZnTe, HgS, HgSe, HgTe, ZnSeS, ZnSeTe, ZnSTe, HgSeS, HgSeTe, HgSTe, HgZnS, HgZnSe, HgZnTe, HgZnSeS, HgZnSeTe, and HgZnSTe; a Group III-V semiconductor nanocrystal selected from GaN, GaP, GaAs, AlN, AlP, AlAs, InN, InP, InZnP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs; or a Group IV-IV semiconductor nanocrystal selected from SbTe; or a combination thereof.

28. The backlight unit of claim 18, wherein the quantum dot comprises a core comprising InP, InZnP, or a combination thereof, and a shell comprising ZnSe, ZnS, or a combination thereof.

29. A display device comprising:

a liquid crystal panel comprising a plurality of color filters; and a backlight unit comprising a light emitting element, a light conversion layer configured to convert light emitted from the light emitting element into white light, and an optical film on the light conversion layer, wherein the backlight unit is configured to supply the white light to the liquid crystal panel, wherein the backlight unit is the backlight unit of claim 18.

30. The display device of claim 29, wherein after passing through the plurality of color filters, the white light has a percentage of areas of a green peak and a red peak of less than or equal to about 10% relative to an entire area of a blue peak in a blue spectrum.

31. The display device of claim 29, wherein after passing through the plurality of color filters, the white light has a percentage of an area of a blue peak of less than or equal to about 1% relative to an entire area of a blue peak in a green spectrum.

32. The display device of claim 29, wherein after passing through the plurality of color filters, the white light has a percentage of a blue peak and a green peak of less than or equal to about 0.5% relative to an entire area of a blue peak in a red spectrum.

* * * * *